United States Patent [19]

Swab

[11] 4,316,221
[45] Feb. 16, 1982

[54] APPARATUS FOR SEQUENTIAL ROW INJECTION READOUT OF CID IMAGERS

[75] Inventor: John M. Swab, Baldwinsville, N.Y.

[73] Assignee: General Electric Company, Syracuse, N.Y.

[21] Appl. No.: 175,625

[22] Filed: Aug. 5, 1980

[51] Int. Cl.³ .......................... H04N 5/30; H04N 3/14
[52] U.S. Cl. .................................................. 358/213
[58] Field of Search ....................... 358/213, 209, 212; 250/211 R, 211 J, 578, 370; 357/30, 32

[56] References Cited

U.S. PATENT DOCUMENTS 3,935,446  1/1976  Michon ............................ 250/211 J
4,129,887 12/1978  Michon .............................. 358/213

OTHER PUBLICATIONS

Barbe, "Imagining Devices Using the Charge-Coupled Concept", Proceedings of IEEE, vol. 63, #1, pp. 46–49, Jan. 1975.

Primary Examiner—Michael A. Masinick
Attorney, Agent, or Firm—Richard V. Lang; Carl W. Baker

[57] ABSTRACT

Apparatus is provided for periodically reading image intensity information from M rows x N columns of charge storage sites in a CID array imager. The magnitudes of signal charges collected at the sites in response to incident radiation are sensed by measuring changes in potential on column lines connected to the respective columns of sites. These changes in potential are caused by sequentially applying specific potentials to row lines connected to the respective rows of sites to effect injection of the signal charges into the substrate of the array. The apparatus operates to minimize charge transfers within the array during readout and is thus capable of accurately determining the magnitude of signal charges in arrays fabricated from semiconductor materials having low charge transfer efficiencies. The apparatus includes means for eliminating the effects of thermal (KT/C) noise from output voltages representative of the signal charge magnitudes.

6 Claims, 18 Drawing Figures

APPARATUS FOR SEQUENTIAL ROW INJECTION READOUT OF CID IMAGERS

BACKGROUND OF THE INVENTION

1. Field of the Invention

This invention relates to solid state imagers and in particular to the readout of image information from charge transfer device arrays.

2. Description of the Prior Art

One of the most useful solid state image sensors is the CID (charge injection device) array. Such an array comprises a matrix of CID storage sites in which signal charges are collected in proportion to the intensity of incident radiation forming an image focused onto the array. The CID array has good antiblooming capabilities, is immune from image burn and has a higher modulation transfer function than other charge transfer devices, such as CCDs. Despite these advantages, however, difficulties have been experienced in accurately reading the magnitudes of the charges collected at the discrete sites of CID arrays fabricated from certain semiconductor materials.

Figure 1:
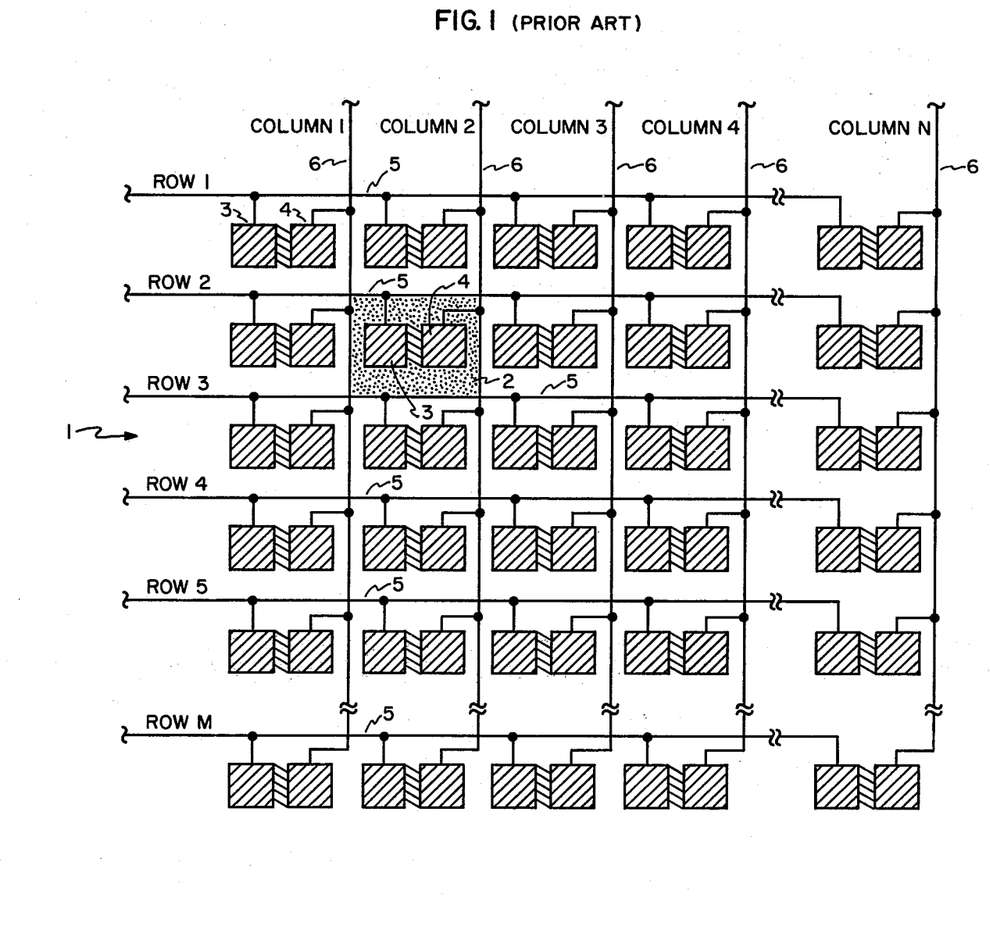
FIG. 1 is a schematic illustration of a typical CID array with which the invention may be utilized.

These difficulties can be best understood by referring to FIG. 1 which schematically illustrates a conventional CID array. The array 1 comprises a substrate of semiconductor material of one conductivity type supporting a layer of insulator material on which are formed a multiplicity of conductive pads. The array is geometrically divided into a plurality of charge storage sites, such as that indicated at 2, for collection of radiation-generated minority carriers. Each of the sites includes a pair of the pads, designated a row pad 3 and a column pad 4, and each pad defines a CIS (conductor, insulator, semiconductor) capacitive cell comprising the pad itself and the underlying portions of the insulating and semiconductor layers. The charge storage capacity of each cell is determined by the size of a potential well formed in the semiconductor layer thereof by a potential established on the cell pad. The two pads at each site are closely coupled, as is known in the art, to enable charge to be transferred between the capacitive cells in the site. The row pads in each row are electrically connected to a respective row line 5. Similarly, the column pads in each column are electrically connected to a respective column line 6.

In the prior art, readout of the array is typically accomplished by apparatus for sequentially selecting the individual sites and applying voltages of predetermined magnitudes to the row and column lines connected thereto. The magnitudes of these voltages are chosen such that they change the sizes of the potential wells in the row and column cells of the selected site in a manner which effects transfer of the signal charge out of one or both of the cells. The magnitude of the transferred signal charge is then sensed by detecting changes in potential on either the row or the column line and producing a signal voltage representing the magnitude of the charge transferred. One such prior art read-out apparatus is described in U.S. Pat. No. 3,935,446 to Gerald J. Michon which is assigned to the assignee of the present invention and is incorporated herein by reference.

Such prior art circuitry has been effective for determining the magnitudes of charges collected in the individual sites of arrays fabricated from semiconductor materials having high charge transfer efficiencies, such as silicon, but it has not been effective for determining the magnitudes of charges collected in arrays fabricated from materials having lower charge transfer efficiencies, such as indium antimonide. It is desirable to utilize arrays fabricated from these latter materials because they are particularly suitable for detecting radiation in the infrared portion of the spectrum.

One of the reasons for the above-described ineffectiveness of prior art readout circuitry can be understood by considering the effect, at unselected sites, of the application of the predetermined voltages to the row and column lines of a selected site. When these voltages are applied to a selected row line m and a selected column line n, the size of the potential wells is changed not only in the row and column cells of the selected site at the coordinate m, n, but also in all other row cells in row m and in all other column cells in column n. This change in size of the potential wells at non-selected sites causes charge transfers between the row and column cells at these sites which are unnecessary for sensing the signal charge at the selected site. In semiconductor materials with low charge transfer efficiencies these charge transfers are often imperfect and thus the charge transferred between cells is not precisely the magnitude expected. In such case, a spurious signal representative of the cumulative errors in the magnitudes of the charges transferred at the unselected sites connected to the selected row and column line is developed on each of these lines. Of particular interest is the spurious signal developed on the line utilized to produce the signal voltage representative of the signal charge transferred at the selected site. The magnitude of this signal is significant with respect to the magnitude of the signal voltage developed on the line and causes a substantial error in the measurement of the signal charge at the selected site. It is desirable to prevent the production of such spurious signals on the lines utilized to produce the signal voltages.

Figure 2:
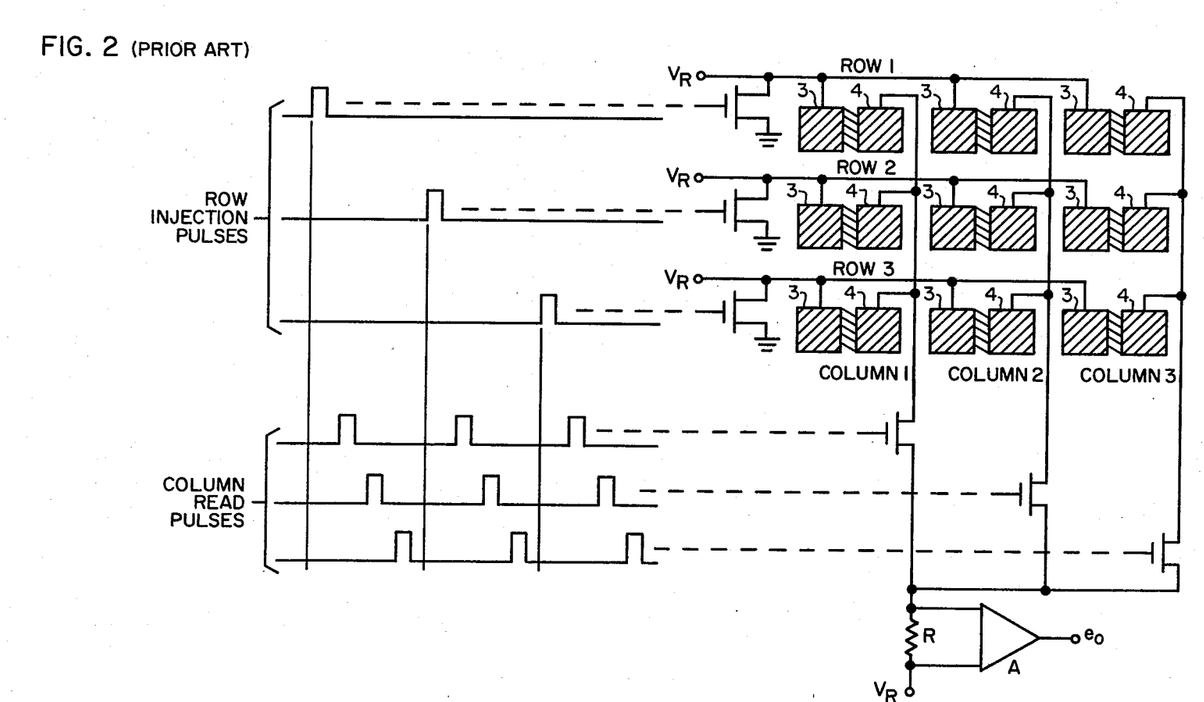
FIG. 2 is a schematic illustration of a prior art circuit utilized to sense the signal charges collected at individual sites in a CID array.
Figure 3A:
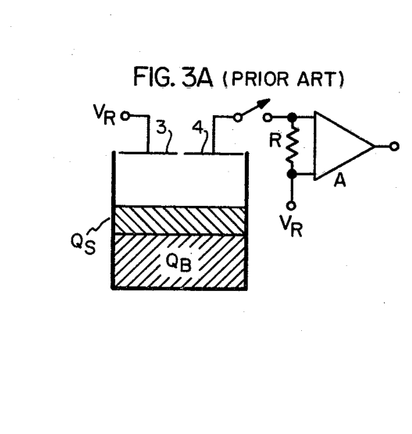
FIGS. 3A through 3D illustrate the sequence of events occurring during the sensing of the signal charge at a specific site of the array by the circuit of FIG. 2.

A prior art readout circuit which accomplishes this objective in arrays having high charge transfer efficiencies is illustrated schematically in FIG. 2. This circuit accomplishes the objective by producing each signal voltage on the selected column line while avoiding charge transfers in all sites connected to this column line, except that in the selected row. During operation of the circuit, a potential $V_R$ is continually applied to all pads in the array. This potential establishes equal charge storage capacities in the row and column cells of each site as is illustrated by the potential well diagram of FIG. 3A. At each site there are a bias charge of magnitude $Q_B$ and a signal charge of magnitude $Q_S$ which are equally shared by the row and column cells. The bias charge in each site is the maximum charge that can be stored in a column cell when the potential $V_R$ is applied to the column pad thereof. The signal charge in each site is the charge collected at the site between readings.

Figures 3B, 3C:
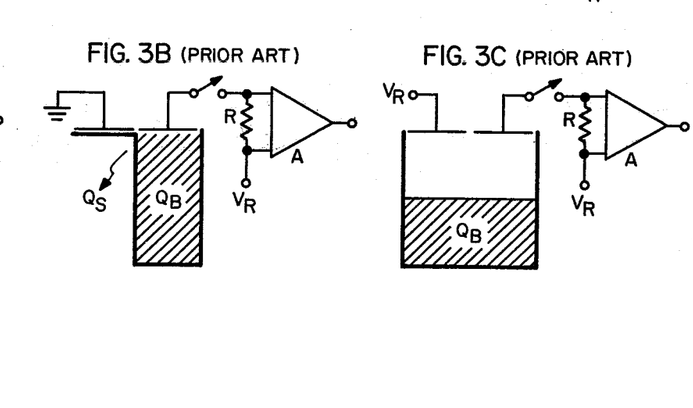

As is shown in a timing diagram included in FIG. 2, reading of the array is begun by applying a row injection pulse to a transistor switch connecting row line 1 to ground potential. This essentially collapses the potential well in the row cells of row 1 (to about 0.1 volt in silicon) and causes charge to be transferred into the respective column cells until they are filled to capacity (FIG. 3B). Because each column cell is capable of holding the bias charge only, the signal charge in each site of row 1 is injected into the substrate.

Figure 3D:
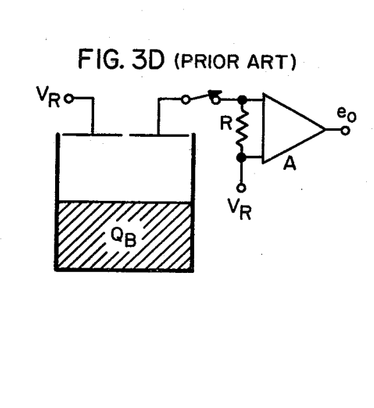

After the row injection pulse terminates, the potential $V_R$ is re-established in row line 1, re-establishing the charge storage capacities existing in the row cells prior to injection and causing the bias charges to again be equally shared by the row and column cells at each site (FIG. 3C). The absence of signal charge at each site in row 1 causes the voltages on the respective column pads to differ from the potential $V_R$ previously established thereon by a potential difference proportional to the magnitude of the signal charge injected therefrom. These potential differences are measured by sequentially applying column read pulses to transistor switches connecting the individual column lines to one side of a resistor R having the opposite side referenced to the potential $V_R$. As each column line is thus connected, current having an amplitude proportional to the respective potential difference passes through R causing the potential $V_R$ to be re-established on the column line (FIG. 3D). This current amplitude is sensed by an amplifier A which produces a signal voltage $e_o$ representative of the magnitude of the signal charge injected at the respective site in row 1.

After the signal charges injected at the row 1 sites have been sensed, the signal charges in the remaining rows are sequentially injected and sensed in similar fashion. Because this manner of reading the array causes charge transfers only in the row of sites being read, and thus causes no spurious signals on the column lines, the circuit of FIG. 2 would seem useful for reading arrays having low charge transfer efficiencies as well as those having high charge transfer efficiencies. Such is not the case, however. It has been found that the collapsing of potential wells to sense signal charges in a selected row of sites, as is depicted in FIG. 3B, causes production of spurious signal by the selected row itself. This results because all charge cannot be readily transferred out of cells in semiconductor materials of low charge transfer efficiency and charge erroneously remaining in the cell with the collapsed potential well causes a corresponding error in the measurement of the charge injected at the site.

Another problem, experienced with CID array readout circuitry in general, is thermal (KT/C) noise produced within the impedances of transistor switches utilized to make connections with the column or row lines on which the signal voltages are produced. For a discussion of the cause and the magnitude of thermal noise refer to M. Schwartz; Information Transmission, Modulation and Noise; pages 213-215 (1959). The instantaneous amplitude of this noise at the time each switch is opened causes an unpredictable offset in a DC reference voltage established on the line connected to the switch and this offset causes a corresponding error in the signal voltage later produced. A correlated double sampling technique useful for eliminating thermal noise is described by D. Barbe in Imaging Devices Using the Charge-Coupled Concept, Proceedings of the IEEE, Vol. 63, No. 1, pages 46-49 (January 1975). Use of this technique requires that the actual voltage on each line be sampled after opening of the switch connected thereto and again at the time the signal voltage is produced. Such double sampling is not feasible in prior art circuitry such as that illustrated in FIG. 2, because the amplifier used to sense the signal voltage on each line is sequentially switched from line to line after the signal voltages are produced.

SUMMARY OF THE INVENTION

It is an object of the invention to provide an accurate readout of image intensity information from CID arrays having low charge transfer efficiencies as well as from those having high charge transfer efficiencies.

It is another object to provide such a readout which prevents the production of the aforementioned spurious signals on the readout lines.

It is a further object to provide such a readout which eliminates the effects of thermal noise.

These and other objects are accomplished by providing a unique circuit arrangement which effects column line readout without causing charge transfers in rows other than that of the site currently selected for reading and without collapsing the potential wells in any of the sites. The circuit also facilitates the production of signal voltages from which the effects of thermal noise have been eliminated. This circuit arrangement includes potential sources for producing specific potentials, measuring means for measuring potentials produced on individual column lines and switches for connecting selected row and column lines to the potential sources and the measuring means.

A first set of switches periodically connects the source of a ROW COLLECTION potential to the row lines and connects the source of a COLUMN COLLECTION potential to the column lines to establish these potentials on the row and column lines, respectively. These potentials establish a charge storage capacity at each site in the array which is sufficient to hold both a bias charge of predetermined magnitude and the signal charge collected between successive readings of the site. They also establish a predetermined distribution of the bias charge between the row and column cells of each site.

A second set of switches sequentially connects the column lines to the measuring means. During the closure of each of these switches a third set of switches sequentially connects the row lines to a voltage producing means which successively produces an INJECTION potential and the ROW COLLECTION potential. The INJECTION potential reduces the charge storage capacities of the row and column cells of each site in the connected row to magnitudes which are collectively sufficient to hold the bias charge only, thus causing injection of the signal charge contained therein. The row cells are not collapsed and no attempt is made to eliminate all charge therefrom. The subsequent application of the ROW COLLECTION potential re-establishes the predetermined distribution of the bias charge between the row and column cells of the row.

Use of the aforementioned double sampling technique is made possible by the above-described sequence in which the individual sites are read. The measuring means twice samples the potential on each column line connected thereto. The first sample is taken prior to application of the INJECTION potential to the selected row line and the second sample is taken after the ROW COLLECTION potential is re-established on the row line. The difference in these potentials is representative of the magnitude of the signal charge injected at the selected site. Because both samples are taken during an interval when none of the switches connected to the column lines are opened, the difference in potential between the samples is not affected by thermal noise. This adaptation of the aforementioned double sampling technique is made possible by the unique sequence in which the individual sites are read. It would not be possible, for example, with the prior art read sequence depicted in FIG. 2, because the switches connecting the column lines to the amplifier circuitry are not closed until after injection occurs.

In an alternative embodiment of the invention, the second set of switches is eliminated and an individual measuring means is provided for each column line. This circuit arrangement makes possible the simultaneous readout of an entire row of sites.

DESCRIPTION OF THE PREFERRED EMBODIMENTS

To simplify explanation of the invention, the sequential reading of the signal charges in two sites in adjacent rows of the CID array will first be explained with reference to drawing FIGS. 4A-4D and 5A-5D, respectively. FIGS. 4A-4D illustrate the potential wells and the charge distributions of the sites located in column 1, rows 1 and 2, in successive time intervals during which ROW COLLECTION, COLUMN COLLECTION and INJECTION potentials are applied to the array to effect sensing of the signal charge in the row 1, column 1 site. Similarly, FIGS. 5A-5D illustrate the charge distributions at the same sites in successive time intervals during which the same potentials are applied to the array to effect sensing of the signal charge in the row 2, column 1 site.

The distribution of charge at each site in the array is determined by the depths of the potential wells formed under the site's row pad 3 and column pad 4. These potential wells are established by applying one of the above-cited potentials to each pad. The depth of each well determines the charge storage capacity of the respective site.

The charge contained in the row 1 site comprises a signal charge of magnitude $Q_{S1}$ collected during the time since the site was last read, and a bias charge of magnitude $Q_B$. Similarly, the charge contained in the row 2 site comprises a signal charge of magnitude $Q_{S2}$ and the bias charge of magnitude $Q_B$. The bias charge is maintained at the magnitude $Q_B$ in all sites and is defined as the maximum charge which a site can hold when the INJECTION potential is established on the row pad and the COLUMN COLLECTION potential is established on the column pad.

Figure 4A:
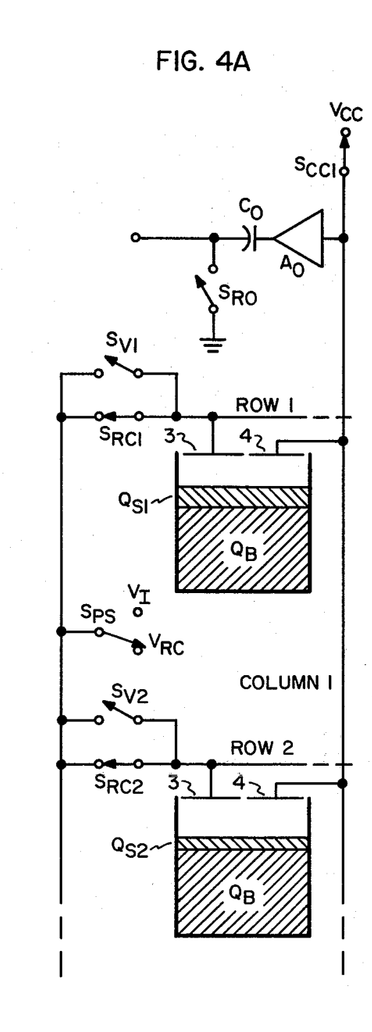
FIGS. 4A through 4D illustrate the sequence of events occurring during the sensing of signal charge from a first site, in accordance with the invention.

FIG. 4A shows the conditions of the two illustrated sites just prior to the selection of the row 1 site for sensing of the signal charge therein. Switches $S_{RC1}$, $S_{RC2}$ are closed connecting row lines 1, 2 to the ROW COLLECTION potential $V_{RC}$ through a potential select switch $S_{PS}$. Similar switches $S_{RC3}$, ... $S_{RCM}$ (not shown) connect the remaining row lines 3, ... M to the ROW COLLECTION potential through the switch $S_{PS}$. A switch $S_{CC1}$ is also closed connecting column line 1 to the COLUMN COLLECTION potential $V_{CC}$. Similar switches $S_{CC2}$, ... $S_{CCN}$ (not shown) connect the remaining column lines 2, ... N to the COLUMN COLLECTION potential. This application of the ROW COLLECTION and COLUMN COLLECTION potentials to the row and column pads in the array, by means of the row and column lines, establishes a charge storage capacity at each site in the array which is sufficient to hold both the bias charge of magnitude $Q_B$ and the signal charge collected between the successive readings. Even more importantly, with respect to the site to be selected, these potentials establish a predetermined distribution of the bias and the signal charges between the row and column cells. For the potential wells illustrated, equal voltages (typically $V_{RC}=V_{CC}=-12$ VDC have been applied to the row and column lines causing the bias and signal charges to be equally distributed between the row and column cells of each site. This assumes that the row and column cells are of equal capacitance. If these capacitances are not equal in the particular array being read the potentials required to establish equal charge storage capacities will be different as can be determined from the equation:

$$V = Q/C \qquad (1)$$

where Q is the charge storage capacity of a cell and C is the capactiance.

Figure 4B:
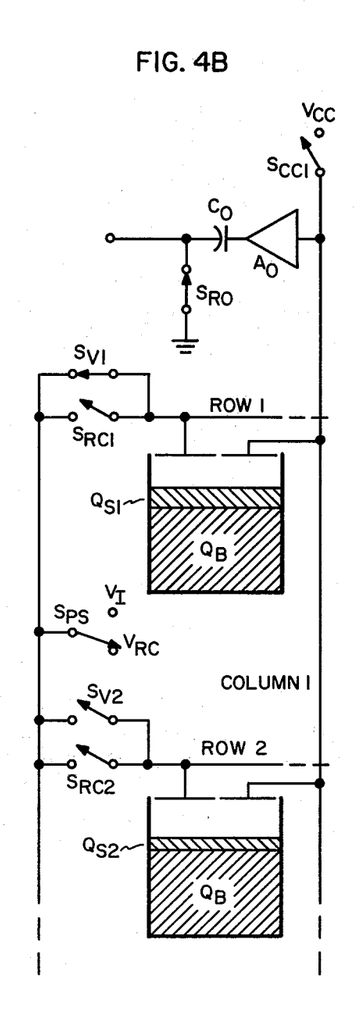

FIG. 4B illustrates the conditions of the two sites after the site in row 1 has been selected by closing a row select switch $S_{V1}$. The closing of switch $S_{V1}$ maintains the connection of row line 1 through switch $S_{PS}$ to the ROW COLLECTION potential. Switches $S_{RC1}$, $S_{RC2}$, ... $S_{RCM}$ are opened leaving all other row lines floating at the ROW COLLECTION potential previously established on all row pads in the array. Similarly, switches $S_{CC1}$, $S_{CC2}$, ... $S_{CCN}$ are opened leaving all column lines floating at the COLUMN COLLECTION potential previously established on all column pads in the array. Note that the charge distribution in all sites in the array remains undisturbed from that existing in the time interval depicted in FIG. 4A.

During the time interval depicted in FIG. 4B a sample is taken of the voltage on column line 1 by a measuring circuit comprising an amplifier $A_O$, a capacitor $C_O$ and a reset switch $S_{RO}$. The reset switch $S_{RO}$ is momentarily closed, connecting one side of the capacitor $C_O$ to ground potential and causing it to charge to a voltage $A(V_{CC}+V_{J1})$, where A is the gain of the amplifier $A_O$ connected between the capacitor and column line 1 and the term $(V_{CC}+V_{J1})$ is the potential established on line 1. This potential is the algebraic sum of the COLUMN COLLECTION potential $V_{CC}$ applied through switch $S_{CC1}$ prior to opening thereof and the amplitude of the thermal noise $V_{J1}$ produced by switch $S_{CC1}$ at the instant it was opened.

Figure 4C:
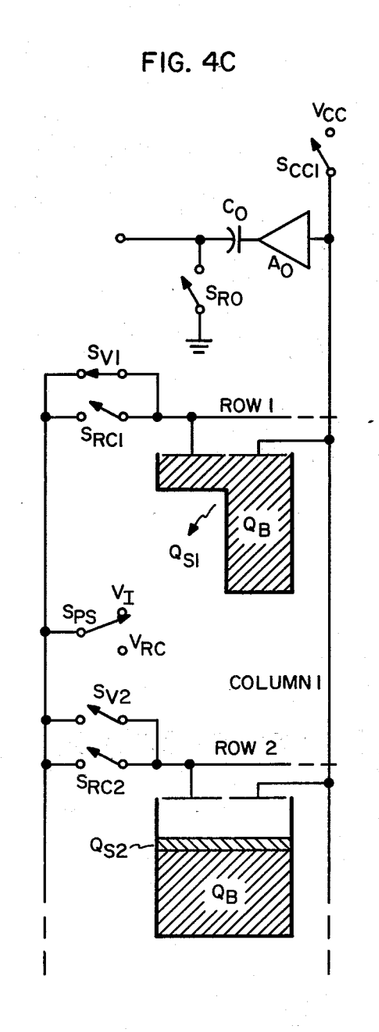

FIG. 4C illustrates the conditions of the two sites during the next time interval. Switch $S_{PS}$ is switched to a position at which the INJECTION potential $V_I$ is applied to row line 1 through row select switch $S_{V1}$. Application of the INJECTION potential (typically $V_I = -7$ VDC) reduces the charge storage capacity at the illustrated row 1 site (and at all other row 1 sites) to a magnitude which is sufficient to hold the bias charge only, thus causing injection of the signal charged contained therein and redistribution of the bias charge between the row and column cells.

Note that the charge in each cell is never reduced below that shown for the row cell in FIG. 4C. The magnitude of the charge in the row cell is maintained above a minimum magnitude, below which attempts to reduce charge would be only partially successful. This minimum magnitude differs for different semiconductor materials. For materials such as silicon the charge in any cell can be reduced to essentially zero. However, in materials of lower charge transfer efficiencies such as indium antimonide it has been found that a minimum charge of approximately $10^{12}$ charge carriers/cm$^2$, maintained by an INJECTION potential of approximately 5 volts, is required.

Figure 4D:
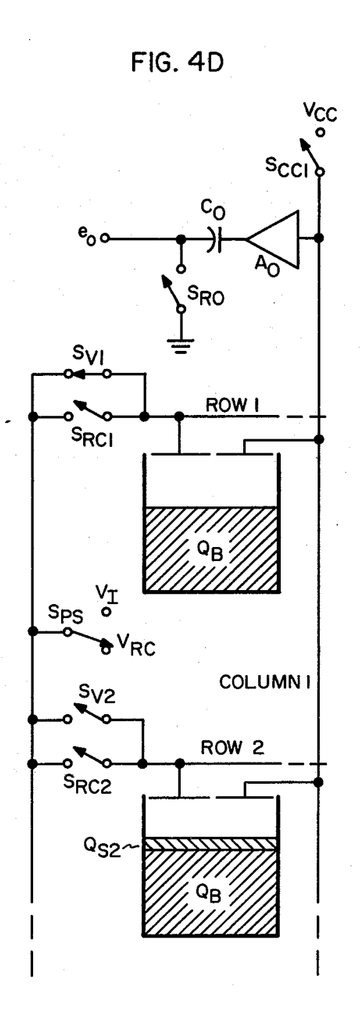

FIG. 4D shows the conditions of the illustrated sites during the final time interval of the charge sensing operation. Switch $S_{PS}$ is switched to the position at which the ROW COLLECTION potential is reapplied to row line 1 through switch $S_{V1}$. This re-application of the ROW COLLECTION potential to the row pads of the sites in row 1 re-establishes the predetermined distribution of the bias charge between the row and column cells of each site in the row and causes a voltage $(V_{CC} + V_{J1} - V_{S1})$ to be developed on column line 1. $V_{S1}$ is the signal voltage which is proportional to the difference between the magnitude of the charge in the illustrated row 1 site prior to injection (as depicted in FIG. 4B) and the magnitude of the charge after injection (as depicted in FIG. 4D). The voltage on the column line is amplified by an amplifier $A_O$ to a voltage $A_O(V_{CC} + V_{J1} - V_{S1})$ and applied to one side of the capacitor $C_O$. An output voltage $e_o$ equal to the difference between the voltage stored on the capacitor and that produced by the amplifier during the time interval of FIG. 4D appears on the opposite side of the capacitor:

$$e_o = [A_O(V_{CC} + V_{J1} - V_{S1})] - [A_O(V_{CC} + V_{J1})]$$
$$= -A_O V_{S1} \qquad (2)$$

Note that the thermal noise component $V_J$ of the voltage stored on the capacitor $C_O$ remains constant because no switch openings occur on the column line during the time intervals depicted in FIGS. 4B-4D. Thus this noise component is eliminated from the signal voltage $e_o$ as is demonstrated by equation 2.

Figure 9:
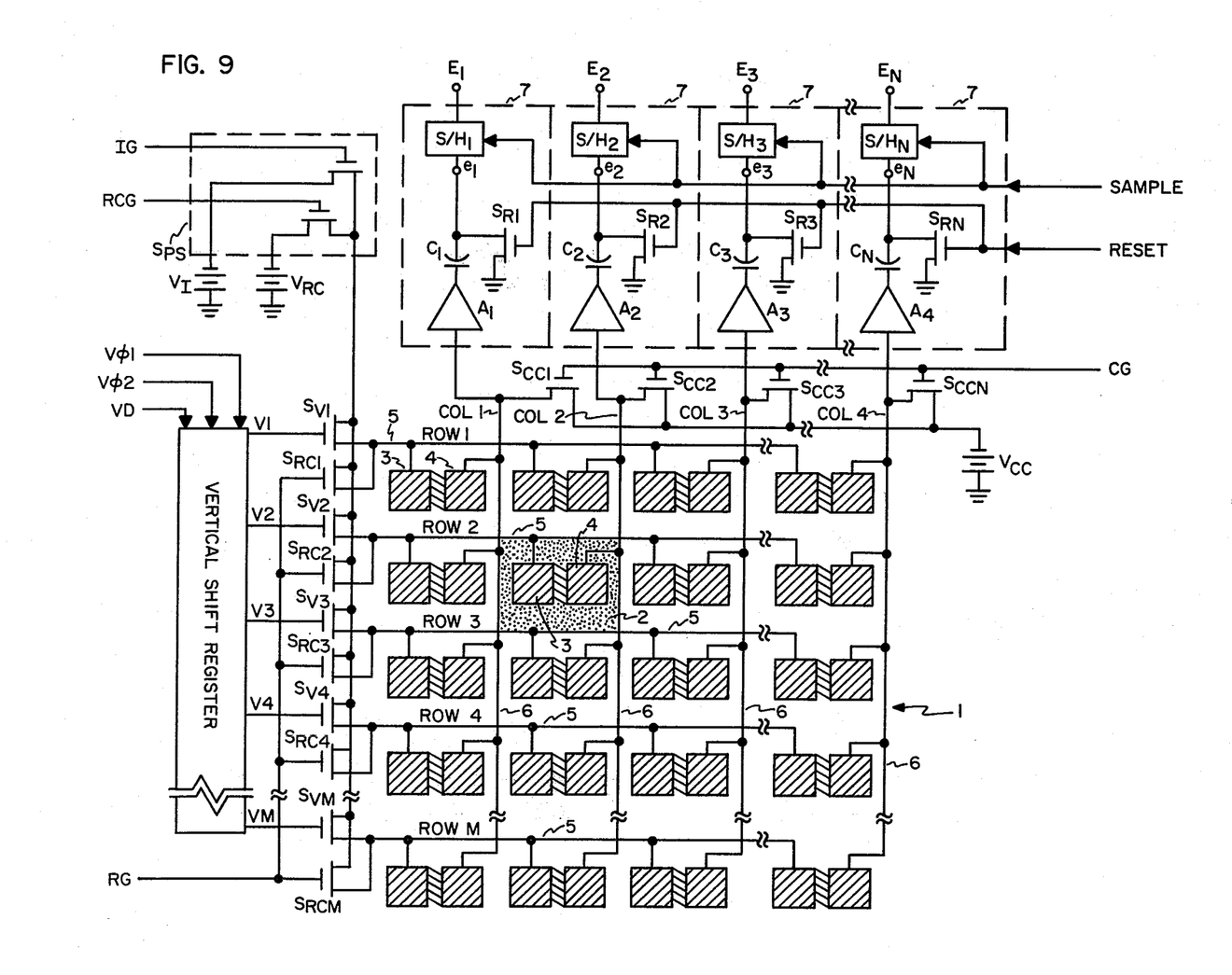
FIG. 9 is a schematic illustration of one form of circuitry which may be utilized to implement a second embodiment of the invention.

Similar output voltages, proportional to the signal charges injected at the other sites in row 1, will be simultaneously produced from the voltages on the other column lines in the array if measuring circuits are also connected thereto. A subsequently described embodiment employing such multiple measuring circuits is illustrated in FIG. 9. If only one measuring circuit is provided, however, the signal charges injected at the other sites in row 1 will not be read at this time. Rather the signal charges in all column 1 sites will be sequentially sensed and then the single measuring circuit will be connected to each column line in turn for a time period during which the magnitudes of the signal charges in all sites in the respective column are sequentially sensed in the same manner as the column 1 sites.

After the magnitude of the signal charge at the site in row 1, column 1 has thus been sensed, switch $S_{V1}$ is opened and the signal charge in row 2 is next sensed in precisely the same manner as was described for row 1. This is shown in FIGS. 5A–5D which illustrate the charge distributions at the sites located in column 1, rows 1 and 2 in successive time intervals during which the signal charge in the row 2, column 1 site is sensed.

Figure 5A:
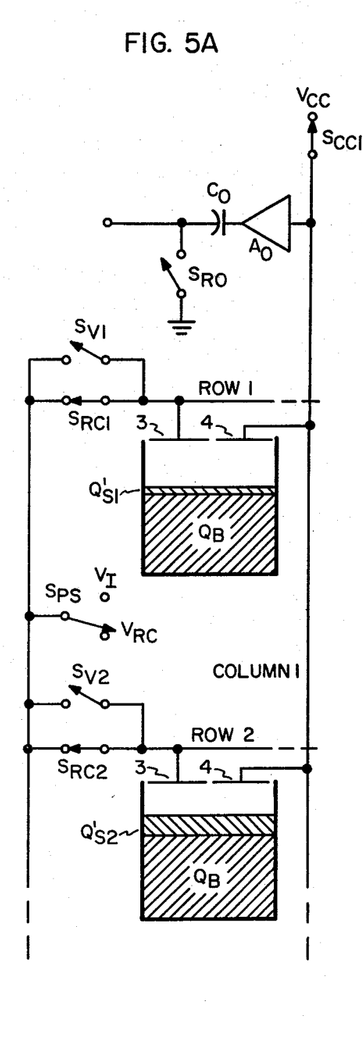
FIGS. 5A through 5D illustrate the sequence of events occurring during the sensing of signal charge from a second site, in accordance with the invention.

FIG. 5A shows the condition of the two illustrated sites just prior to selection of the row 2 site. Switches $S_{RC1}, \ldots S_{RCM}$ are closed connecting the row lines to the ROW COLLECTION potential through the potential select switch $S_{PS}$. Also switches $S_{CC1}, \ldots S_{CCN}$ are closed connecting the column lines to the COLUMN COLLECTION potential. Application of the ROW COLLECTION and COLUMN COLLECTION potentials to the row and column pads in the array establishes equal distributions of the bias and signal charges under the row and column pads of each site as previously described.

Note that the magnitudes of the signal charges in the sites of the array will have increased slightly if additional charge has been collected therein since the signal charge in the site in row 1 was sensed. For example, the magnitude of the charge in the row 2 site has been illustrated as increasing slightly from $Q_{S2}$ to $Q_{S2}'$ because of additional charge collected in response to radiant energy received at the site. Similarly, a signal charge of magnitude $Q_{S1}'$ has been collected in the row 1 site since the injection of the charge $Q_{S1}$ has occurred.

Figure 5B:
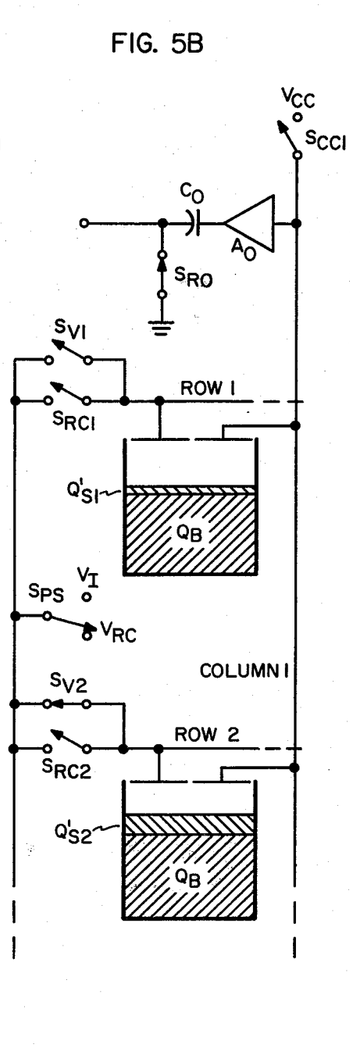

FIG. 5B illustrates the conditions of the two sites after the site in row 2 has been selected by closing a row select switch $S_{V2}$. The closing of switch $S_{V2}$ maintains the connection of row line 2 to the ROW COLLECTION potential through switch $S_{PS}$. Switches $S_{RC1}, \ldots S_{RCM}$ are opened leaving all other row lines floating at the ROW COLLECTION potential previously established on all row pads in the array. Similarly, switches $S_{CC1}, \ldots S_{CCN}$ are opened leaving all column 1 lines floating at the COLUMN COLLECTION potential previously established on all column pads in the array. Also, the switch $S_{RO}$ is momentarily closed causing the capacitor $C_O$ to charge to the amplified voltage $A_O(V_{CC} + V_{J2})$ established on the column line. $V_{J2}$ is the voltage component contributed by thermal noise in the switch $S_{CC1}$ at the instant it was last opened.

Figure 5C:
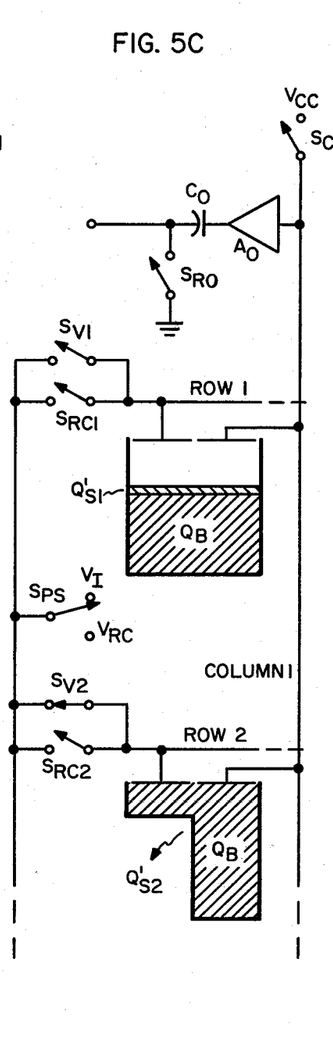

FIG. 5C illustrates the conditions of the two sites during the next time interval. Switch $S_{PS}$ is switched to the position at which the INJECTION potential is applied to row line 2 through row select switch $S_{V2}$ causing injection of the signal charge at the illustrated row 2 site and at all other sites in row 2.

Figure 5D:
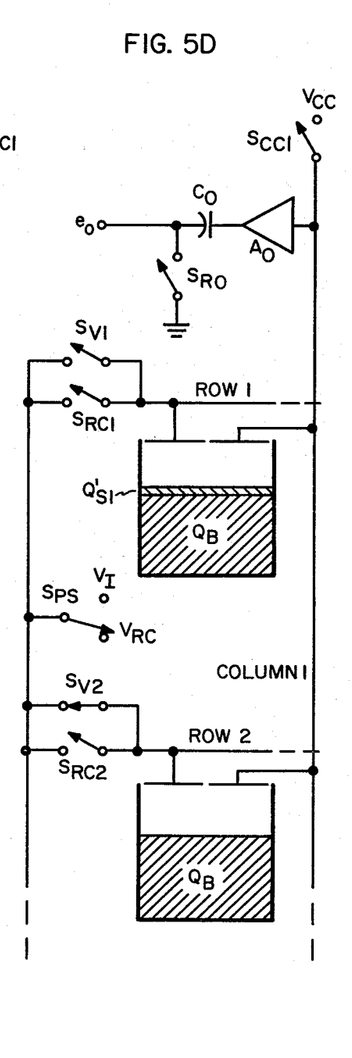

FIG. 5D shows the conditions of the illustrated sites during the final time interval of the charge sensing operation. Switch $S_{PS}$ is switched to the position at which the ROW COLLECTION potential is re-applied to row line 2 through switch $S_{V2}$. This re-application of the ROW COLLECTION potential to the row pads of the sites in row 2 re-establishes the predetermined distribution of the bias charge between the row and column cells of each site in the row and causes a voltage $(V_{CC}30 \ V_{J2} - V_{S2}')$ to be developed on column line 1. $V_{S2}'$ is the signal voltage which is proportional to the difference between the charge in the illustrated row 2 site prior to injection (as depicted in FIG. 5B) and that after injection (as depicted in FIG. 5D). The voltage on the column line is amplified by amplifier $A_O$ to a voltage $A_O(V_{CC}+V_{J2}-V_{S2}')$ and is applied to one side of the capacitor. A voltage equal to the difference between the voltage stored on the capacitor and that produced by the amplifier appears on the opposite side of the capacitor as an output voltage:

$$e_o = [A_O(V_{CC}+V_{J2}-V_{S2}')] - [A_O)V_{CC}+V_{J2})] = -A_O V_{S2}' \quad (3)$$

Similar output voltages, proportional to the signal charges injected at all other sites in row 2, will be simultaneously produced from the voltages on the other column lines in the array if sampling circuits are also connected thereto.

Figure 6:
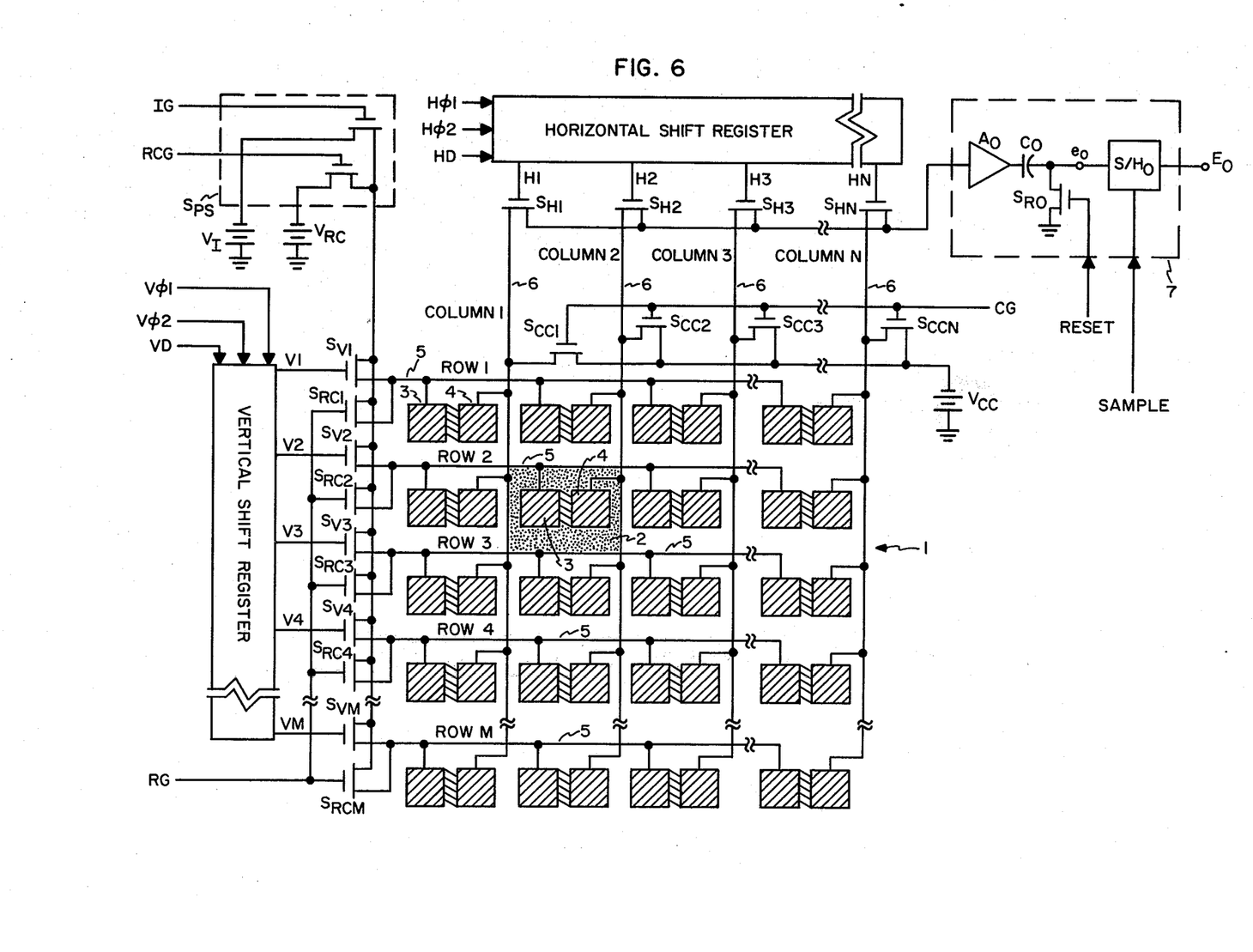
FIG. 6 is a schematic illustration of one form of circuitry which may be utilized to implement a first embodiment of the invention.

The above-described procedure is repeated until the remainder of the M row x N column array is read. One embodiment of an apparatus for performing this procedure is illustrated in FIG. 6. The embodiment includes the array 1, FET switches connected between the sources of potentials $V_I$, $V_{RC}$, $V_{CC}$ and the row and column lines, a single measuring circuit 7, and FET column select switches connected between the measuring circuit and the individual column lines.

The FET switches connected between the row-/column lines and the sources of potential $V_I$, $V_{RC}$, $V_{CC}$ correspond to the switches $S_{PS}$; $S_{RC1}$, ... $S_{VM}$; $S_{CC1}$, ... $S_{CCN}$ previously discussed in conjunction with figures 4A-4D, 5A-5S and are identified with identical indicia. The FET column select switches connected between the measuring circuit 7 and the column lines 1, 2, ... N are identified as $S_{H1}$, $S_{H2}$, ... $S_{HN}$, respectively.

Figure 7:
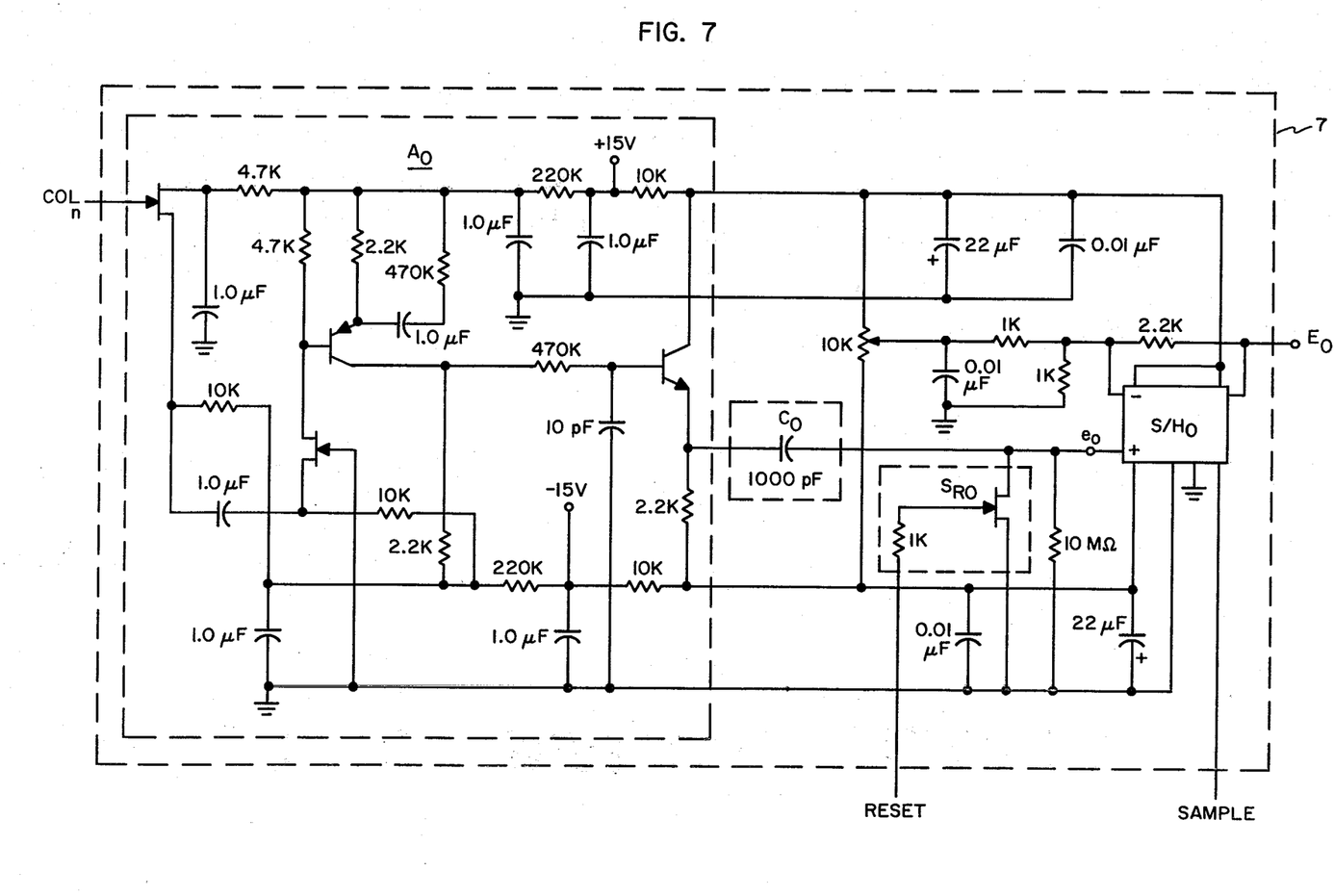
FIG. 7 is a detailed schematic illustration of a portion of the circuitry illustrated in FIG. 6.

The measuring circuit 7 comprises the amplifier $A_O$, the capacitor $C_O$ and a FET implementation of the switch $S_{RO}$ illustrated in FIGS. 4A-4D, 5A-5D. Additionally, the measuring circuit includes a sample-and-hold circuit $A/H_O$ which is utilized to sample the output voltage $e_o$ the moment it is produced from the column line to which the measuring circuit is connected and to produce a DC output signal $E_O$ representative thereof. A detailed schematic of the measuring circuit 7, one form thereof, is illustrated in FIG. 7 wherein the amplifier $A_O$, capacitor $C_O$, reset switch $S_{RO}$ and sample-and-hold circuit $S/H_O$ are separately identified. The specific sample-and-hold circuit utilized in this exemplary circuit is the Analog Devices part number SHA-2A.

Figure 8:
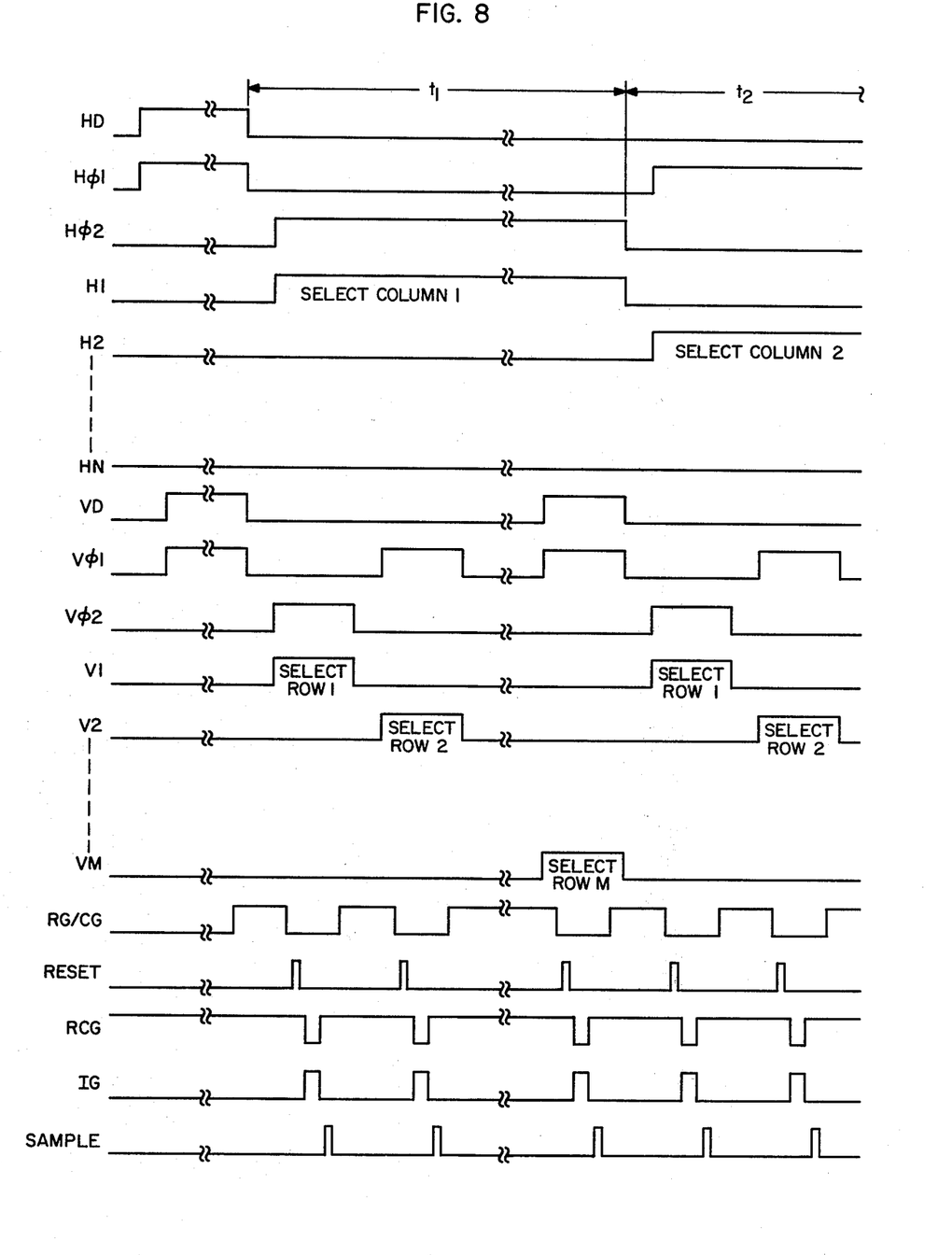
FIG. 8 illustrates signals produced by the circuitry of FIG. 6.

Timing signals utilized to close the row select switches $S_{V1}.S_{V2}$, ... $S_{VM}$ and the column select switches $S_{H1}$, $S_{H2}$, ... $S_{HN}$ are provided by a vertical shift register and a horizontal shift register, respectively, having outputs of successive stages therein connected to respective ones of the row and column select switches. These and all other signals produced during reading of the image intensity information from the array are illustrated in FIG. 8.

Each time it is desired to sense the magnitudes of the signal charges in the array a horizontal data pulse HD representing a logical ONE is applied to an input of the horizontal shift register. This logical ONE is shifted through the shift register by alternately-occurring horizontal clock pulses H$\phi$1, H$\phi$2 applied to respective inputs of the shift register. On the occurrence of each successive horizontal clock pulse, the logical ONE is shifted to the next successive stage of the shift register causing the output of the stage to produce a column select pulse. Each column select pulse is produced simultaneously with its respective horizontal clock pulse and causes connection of one of the column lines to the measuring circuit 7. For example, a column select pulse designated H1 is produced during a time period $t_1$ to close column select switch $S_{H1}$ and thus connect column line 1 to the measuring circuit. Similarly, column select pulses designated H2, H3, ... HN are produced during successive time periods $t_2$, $t_3$, ... $t_N$ to successively connect column lines 2, 3, ... N to the measuring circuit.

Just prior to the production of each column select pulse a vertical data pulse VD representing a logical ONE is applied to an input of the vertical shift register. This logical ONE is shifted through the vertical shift register by alternately occurring vertical clock pulses V$\phi$1, V$\phi$2 applied to respective inputs of the shift register. On the occurrence of each successive vertical clock pulse the logical ONE in the vertical shift register is shifted to the next successive stage causing the output of the stage to produce a row select pulse. A set of row select pulses designated V1, V2, ... VM is produced during each of the time periods $t_1$, $t_2$, ... $T_N$ to sequentially effect selection of rows 1, 2, ... M by sequentially closing the row select switches $S_{V1}$, $S_{V2}$, ... $S_{VM}$.

Reading of the array starts at the beginning of time period $t_1$ during the application of a column gate pulse CG and a row gate pulse RG to switches $S_{CC1}$, ... $S_{CCN}$ and switches $S_{RCM}$, ... $S_{RC}$, respectively. The column gate pulse CG causes switches $S_{CC1}$, ... $S_{CCN}$ to close and connect the column lines to a source of the COLUMN COLLECTION potential $V_{CC}$. The row gate pulse RG causes the switches $S_{RC1}$, ... $S_{RCM}$ to close and connect the row lines to a source of the ROW COLLECTION potential $V_{RC}$ through the potential select switch $S_{PS}$.

Switch $S_{PS}$ comprises two FET switches, each connected to a respective source of the potentials $V_{RC}$, $V_I$. The FET switch connected to $V_{RC}$ is closed during the existence of the row gate RG pulse by a row collection gate RCG signal applied thereto. The condition of the array at this time is that illustrated in FIG. 4A with the COLUMN COLLECTION and the ROW COLLECTION potentials applied to all row and column lines, respectively.

Sensing of the signal charge in the row 1, column 1 site begins shortly after the beginning of time period $t_1$. At this time the horizontal shift register begins production of the horizontal select pulse H1, causing column select switch $S_{H1}$ to connect the measuring circuit 7 to column line 1. The first row select pulse V1 is also produced by the vertical shift register causing row line 1 to be connected to switch $S_{PS}$ and therethrough to the ROW COLLECTION potential. The RG and CG pulses are then terminated, opening switches $S_{RC1}$, ... $S_{RCM}$ and $S_{CC1}$, ... $S_{CCN}$, respectively, and a RESET pulse is subsequently applied to switch $S_{RO}$ in the measuring circuit. The RESET pulse momentarily closes the switch and causes the capacitor $C_O$ to charge to the voltage $A(V_{CC}=V_{J1})$ established on column line 1 upon the just-mentioned opening of switch $S_{CC1}$. At this time the condition of the array is as illustrated in FIG. 4B.

As can be seen from FIG. 8, the next event occurring during the existence of the row 1 select pulse V1 is the momentary production of an injection gate pulse IG, and the simultaneous momentary termination of the RCG signal. This causes momentary closure of the transistor switch in $S_{PS}$ which is connected to the source of INJECTION potential $V_I$ while the other transistor switch is $S_{PS}$ is opened and the INJECTION potential is applied through row select switch $S_{V1}$ to row line 1. At this time the signal charges at all sites in row 1 are injected as is depicted in FIG. 4C.

Upon termination of the IG pulse, the RCG signal is resumed and the ROW COLLECTION potential is reapplied to row line 1 through $S_{PS}$ and $S_{V1}$. This re-establishes the predetermined distribution of the bias charge between the row and column cells of row 1, as is illustrated in FIG. 4D, and causes the amplified potential $A_O(V_{CC}+V_{J1}-V_{S1})$ to be produced by amplifier $A_O$. The output voltage $e_o = -A_O V_{S1}$, representing the signal charge injected at the row 1, column 1 site, is sampled during application of a SAMPLE pulse applied to the sample-and-hold circuit S/H$_O$. Consequently, the sample-and-hold circuit produces the DC output signal $E_O$. After termination of the SAMPLE pulse, the V1 row select pulse is also terminated causing row select switch $S_{V1}$ to open. This concludes the sensing of the signal charge $Q_{S1}$.

During the remainder of time period $t_1$ the signal charges in the remainder of the sites in column 1 are sequentially sensed, in the above-described manner, during production of row select pulses V2, V3, . . . VM. Upon the production of row select pulses VM, during which the signal charge in the site in row M is read, a vertical data pulse VD is again applied to the vertical shift register to initiate another sequence of row select pulses V1, . . . VM. These pulses occur during time period t2 when the column 2 select pulse H2 is produced by the horizontal shift register, connecting the measuring circuit to column line 2. The charge sensing operation is then repeated for every site in column 2. During each subsequent column select pulse (H3, . . . HN) the signal charges in another column of sites is sensed in the above-described manner, until the signal charges in all sites of the array have been read.

FIG. 9 illustrates the second embodiment of the invention which is identical to embodiment 1 except for the absence of the horizontal shift register and the column select switches and the connection of a sampling circuit to each of the column lines. This embodiment functions similarly to embodiment 1, but all columns are read simultaneously each time a row is selected by the vertical shift register. The timing signals controlling operation of the embodiment are identical to those illustrated in FIG. 8, except for elimination of the horizontal timing signals (HD, H$\phi$1, H$\phi$2, H1, H2, . . . HN).

Both of the described embodiments have the aforementioned advantages relating to the prevention of spurious signals and the elimination of the effects of thermal noise, but they also have advantages relative to each other. For example, the first embodiment utilizes only a single sampling circuit and thus requires less hardware. The sampling circuits of the second embodiment can be implemented with amplifiers having a lower noise bandwidth, however, because each amplifier senses only M signal charges during each reading of the array rather than M×N. This is also an advantage with respect to prior art readout circuitry employing a single amplifier. One application for which the second embodiment is particularly useful is in time delay and integration arrays. For a description of such arrays refer to an article by A. F. Milton in Topics for Applied Physics, Vol. 19, pages 213-228 (1977).

Although specific embodiments of the invention have been disclosed, it is to be understood that they are only illustrative and the scope of the invention is to be determined from the appended claims.

I claim:

1. Apparatus for periodically reading image intensity information from M rows×N columns of charge storage sites in a CID array imager, said reading being accomplished by sensing the magnitudes of signal charges collected at the charge storage comprising a substrate of semiconductor material supporting a layer of insulating material on which are formed at each site a conductive row pad and a conductive column pad, each pad defining a capacitive cell comprising the pad itself and the underlying portions of the insulating layer and the semiconductor substrate, the row pads for each row of sites being interconnected by a conductive row line and the column pads for each column of sites being interconnected by a conductive column line, said apparatus comprising:

(a) means for applying ROW COLLECTION and COLUMN COLLECTION potentials to the row and column lines prior to sensing the signal charge at each site, said means including:
  (1) a source of the ROW COLLECTION potential,
  (2) a source of the COLUMN COLLECTION potential,
  (3) M switches each connected between a respective row line and said source of ROW COLLECTION potential, and
  (4) N switches each connected between a respective column line and said source of COLUMN COLLECTION potential, said ROW COLLECTION and COLUMN COLLECTION potentials establishing charge storage capacities at the row and column cells of each site which are collectively sufficient to hold both a bias charge of predetermined magnitude and the signal charge collected between successive readings, said potentials further establishing a predetermined distribution of the bias charge between the row and column cells of each site; and (b) means for sensing the magnitude of the signal charge at each site and producing an output voltage representative thereof, said means including:
  (1) measuring means for measuring the difference between first and second potentials successively developed on each column line connected thereto,
  (2) N column select switches each connected between a respective column line and the measuring means,
  (3) means for sequentially closing the N column select switches,
  (4) a source of INJECTION potential which, when applied to a row cell of any site while the charge storage capacity established at the site's column cell by the previously applied COLUMN COLLECTION potential exists, reduces the charge storage capacity in said site to a magnitude sufficient to hold the bias charge only, distributed between the row and column cells, and thereby causes injection of the signal charge contained in the site,
  (5) voltage producing means for alternately connecting the sources of the INJECTION potential and the ROW COLLECTION potential to an output thereof, (6) M row select switches each connected between a respective row line and the output of the voltage producing means, and (7) means for sequentially closing the M row select switches during the closure of each column select switch and thus individually connecting the row lines to the output of the voltage producing means, each row select switch closure being maintained until the INJECTION potential and then the ROW COLLECTION potential are successively applied to the connected row line, thereby causing injection of the signal charges in the sites of the selected row followed by re-establishment of the predetermined bias charge distribution in said sites, said measuring means producing each output voltage by measuring the difference between the potential on the connected column line prior to injection of the charge in each site in the column and the potential on said line after the predetermined distribution of bias charge has been re-established in the site.

2. Apparatus as in claim 1 where said ROW COLLECTION and COLUMN COLLECTION potentials establish charge storage capacities at the row and column cells of each site which are equal.

3. Apparatus as in claim 2 where equal ROW COLLECTION and COLUMN COLLECTION potentials produce said equal charge storage capacities.

4. Apparatus for periodically reading image intensity information from M rows×N columns of charge storage sites in a CID array imager, said reading being accomplished by sensing the magnitudes of signal charges collected at the charge storage sites in response to incident radiation, the array comprising a substrate of semiconductor material supporting a layer of insulating material on which are formed at each site a conductive row pad and a conductive column pad, each pad defining a capacitive cell comprising the pad itself and the underlying portions of the insulating layer and the semiconductor substrate, the row pads for each row of sites being interconnected by a conductive row line and the column pads for each column of sites being interconnected by a conductive column line, said apparatus comprising:

(a) means for applying ROW COLLECTION and COLUMN COLLECTION potentials to the row and column lines prior to sensing the signal charge at each site, said means including:

(1) a source of the ROW COLLECTION potential, (2) a source of the COLUMN COLLECTION potential, (3) M switches each connected between a respective row line and said source of ROW COLLECTION potential, and (4) N switches each connected between a respective column line and said source of COLUMN COLLECTION potential, said ROW COLLECTION and COLUMN COLLECTION potentials establishing charge storage capacities at the row and column cells of each site which are collectively sufficient to hold both a bias charge of predetermined magnitude and the signal charge collected between successive readings, said potentials further establishing a predetermined distribution of the bias charge between the row and column cells of each site; and (b) means for sensing the magnitude of the signal charge at each site and producing an output voltage representative thereof, said means including:

(1) measuring means connected to each column line for measuring the difference between first and second potentials successively developed on said line, (2) a source of INJECTION potential which, when applied to a row cell of any site while the charge storage capacity established at the site's column cell by the previously applied COLUMN COLLECTION potentials exists, reduces the charge storage capacity in said site to a magnitude sufficient to hold the bias charge only, distributed between the row and column cells, and thereby causes injection of the signal charge contained in the site, (3) voltage producing means for alternately connecting the sources of the INJECTION potential and the ROW COLLECTION potential to an output thereof, (4) M row select switches each connected between a respective row line and the output of the voltage producing means, and (5) means for sequentially closing the M row select switches and thus individually connecting the row lines to the output of the voltage producing means, each row select switch closure being maintained until the INJECTION potential and then the ROW COLLECTION potential are successively applied to the connected row lines, thereby causing injection of the signal charges in the sites of the selected row followed by re-establishment of the predetermined bias charge distribution in said sites, each of said measuring means producing the output voltages for the sites in the respective column by measuring the difference between the potential on the connected column line prior to injection of the charge in each site and the potential on said line after the predetermined distribution of bias charge has been re-established in the site.

5. Apparatus as in claim 4 where said ROW COLLECTION and COLUMN COLLECTION potentials establish charge storage capacities at the row and column cells of each site which are equal.

6. Apparatus as in claim 5 where equal ROW COLLECTION and COLUMN COLLECTION potentials produce said equal charge storage capacities.

* * * * *